April 30, 1968 C. G. THORNTON 3,381,182

MICROCIRCUITS HAVING BURIED CONDUCTIVE LAYERS

Filed Oct. 19, 1964

FIG. 1a.

(A) FABRICATION OF MICROCIRCUIT WITH CONDUCTIVE COATING AROUND COMPONENT CONTAINING REGIONS

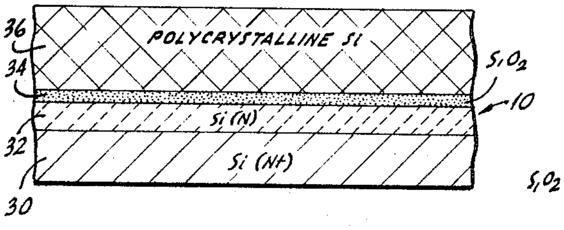

FIG. 3.

MICROCIRCUIT WITH GROUND PLANE. LAPPED-WAFER OXIDE ISOLATION PROCESS.

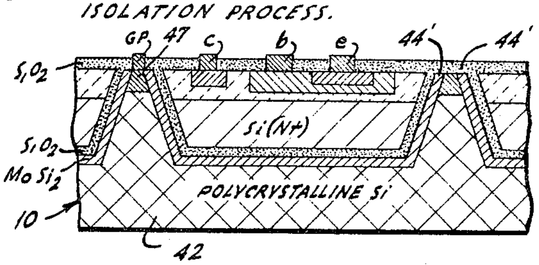

FIG. 1b.

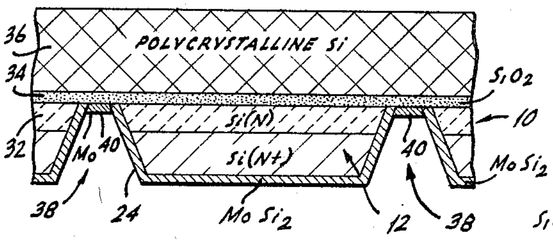

FIG. 4.

MICROCIRCUIT WITH: CONDUCTIVE COATING AROUND COMPONENT CONTAINING REGIONS AND GROUND PLANE

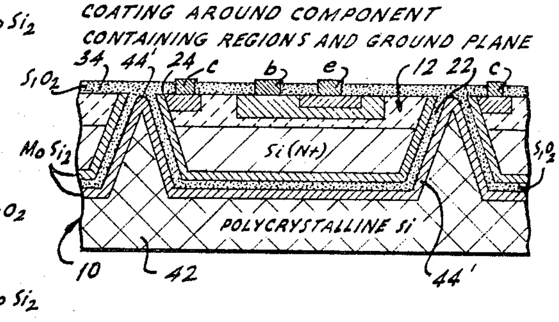

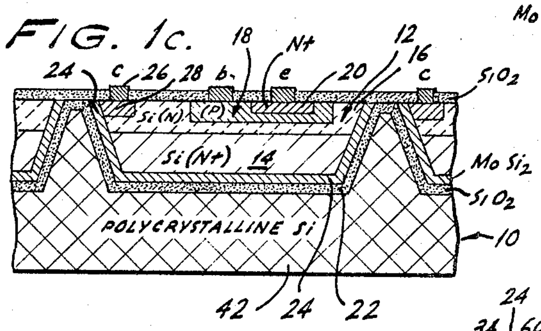
FIG. 1c.

FIG. 5.

MICROCIRCUIT WITH: CONDUCTIVE COATING AROUND COMPONENT CONTAINING REGIONS AND CIRCUIT INTERCONNECTION LAYER

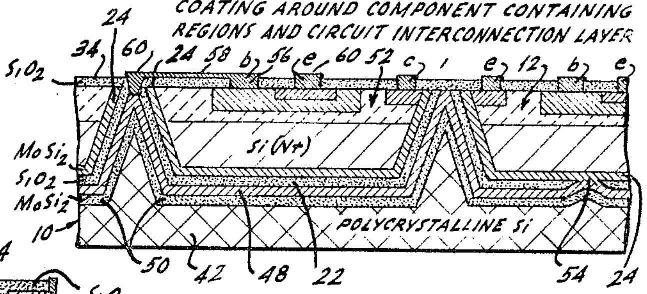

FIG. 2.

MICROCIRCUIT WITH GROUND PLANE. SCHNABLE OXIDE ISOLATION PROCESS

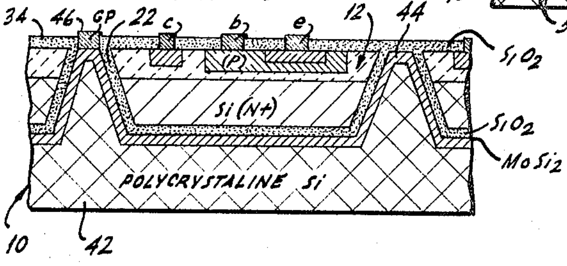

INVENTOR.
CLARENCE G. THORNTON

BY D R Pressman

ATTORNEY

3,381,182
MICROCIRCUITS HAVING BURIED CONDUCTIVE LAYERS

Clarence G. Thornton, Ambler, Pa., assignor to Philco-Ford Corporation, a corporation of Delaware Filed Oct. 19, 1964, Ser. No. 404,800
11 Claims. (Cl. 317—234)

ABSTRACT OF THE DISCLOSURE

Microcircuits having buried conductive layers for use as ground planes, crossunders, and low-resistance connections; and employing polycrystalline silicon wafers with monocrystalline component-containing surface regions with silicide conductive layer(s) and optionally, insulating layer(s), between region and wafer.

This invention relates to semiconductor integrated circuit wafers or chips of the type which comprise a main body of semiconductive material containing one or more component-containing regions which are isolated from each other and the main body, typically by insulating sheaths. More particularly, the invention relates to integrated circuit wafers or chips of the type described which incorporate a buried conductive layer or layers in the vicinity of said insulating sheath and to a process for forming such integrated circuit wafers or chips.

Recently several processes have been discovered which permit the formation of component-containing regions in a main semiconductive body which are isolated from each other and the main semiconductive body by an electrically insulating sheath. According to microcircuit technology, a plurality of circuit components constituting an operational circuit such as a flip-flop or gate are usually formed in a single semiconductor monolith or chip, the individual components being connected together electrically by conductive strips deposited on the surface of the monolith. Many individual monoliths or chips may be formed in a single wafer, each monolith containing a group of circuit components or isolated surface regions in which such components can be formed. The individual monoliths are cut or broken from the wafer after circuit processing has been completed. Heretofore, however, there has been no way of incorporating a conductive ground plane in a semiconductive monolith. As is well known, it would be advantageous to be able to incorporate a ground plane in a semiconductive monolith to reduce lead inductance, provide isolation between the input and output signal paths, etc.

The method of interconnecting circuit components in a microcircuit monolith, i.e., by evaporating metal contacts on the surface of the monolith, is also subject to drawbacks in that it provides only one layer of interconnections without any provision for crossovers. A second interconnecting layer would alleviate the problem of providing crossovers and the problem of high lead inductance due to lengthy interconnecting paths which sometimes are required when a single layer of interconnections is used. It can be shown mathematically that any number of circuit components can be interconnected in any complex arrangement if two layers of circuit interconnections are provided.

Another problem associated with microcircuit technology is that of providing a low resistance connection to the underlying portion of a component-containing region from the surface of the wafer. For instance, in the case of a transistor formed in a microcircuit monolith, the collector saturation resistance of the transistor is appreciable due to the high resistivity of the collector region and the relatively small area of the surface collector contact. A buried low resistivity layer in contact with the collector region has heretofore been incorporated in these devices in order to lower the collector resistance, but even with this layer, the collector resistance is still appreciable. For example, in a typical microcircuit transistor the collector resistance is usually about 10 ohms due to the combined resistance of the high resistivity portions of the collector region (about 4.3 ohms) and the resistance of the buried layer (about 5 ohms). These resistances would be substantially eliminated if a large area conductive contact could be made to the collector region. Accordingly it would be highly advantageous to be able to provide a conductive area connection to the underlying portion of a component-containing region which was contactable from the surface of the wafer.

OBJECTS

Accordingly, several objects of the present invention are:

(1) to provide a new and improved type of microcircuit blank;

(2) to provide a means of incorporating a ground plane in a microcircuit blank or monolith;

(3) to provide a microcircuit monolith having two circuit interconnection layers;

(4) to provide in microcircuit monoliths, means for providing a low resistance connection to the underlying portions of electrically isolated component-containing regions.

Other objects and advantages of the present invention will become apparent from a consideration of the ensuing description thereof.

SUMMARY

In accordance with one aspect of the present invention at least one conductive film is provided between an isolated component-containing region and the main body of a semiconductive monolith for use as ground planes, circuit interconnecting paths, and low resistance contacts to the bottoms of such component-containing regions. These conductive films desirably are associated with insulating films which provide isolation between the conductive films and the main body of the monolith, and/or the conductive films and the component-containing regions.

In accordance with another aspect of the invention, a separate conductive film is provided around each component-containing region by depositing a metal which forms a metallic silicide around each region and a metallic film between regions. Removal of the metallic film with a selective etchant will allow the metallic silicide portions to act as the desired separated conductive films.

DRAWINGS

FIGS. 1(*a*), 1(*b*), and 1(*c*) of the drawing show various steps in the fabrication of a microcircuit with a conductive coating around oxide insulated component-containing regions.

FIG. 2 shows a microcircuit with a ground plane as produced by a preferred oxide isolation process.

FIG. 3 shows a microcircuit with a ground plane produced by a different oxide isolation process.

FIGS. 1(*a*)–1(*c*)

FIGS. 1(*a*), 1(*b*), and 1(*c*) depict steps in the fabrication of a microcircuit wherein a conductive coating is arranged to surround component containing regions in order to provide a low resistance contact to the bottom of said regions. The particular circuit formed in the monolith and the process employed for forming such a circuit on the preformed chip or wafer are not part of this invention.

FIG. 1(*c*) shows a microcircuit chip or monolith 10 in which are formed several component-containing regions. Only the center region 12 will be discussed in describing the present invention. The term component-containing region will be used generically to describe electrically isolated regions such as region 12 whether or not a component, such as a transistor, resistor, etc., has been formed in such region.

Region 12 of monocrystalline silicon, includes a conventional microcircuit transistor consisting of a buried low resistivity (N+) region 14, a higher resistivity N-type collector region 16, a P-type base region 18, and an N-type emitter region 20. A sheath of insulating material 22 electrically insulates component-containing region 12 from wafer 10. Ignoring layer 24 for the moment, it will be noted that the collector resistance of the transistor is high due to the combined resistances of the portion of collector region 16 between contact 26 and region 14 (about 2–3 ohms), region 14 itself (about 5 ohms), and the portion of collector region 16 between region 14 and base region 18 (about 2 ohms). Even if N+ region 28 (which is used principally to provide a suitable surface for deposition of collector contact 26) were diffused deep enough to meet region 14, the collector resistance would be reduced only slightly from the aforedescribed high value.

According to the present invention a conductive layer 24 surrounds component-containing region 12. The use of layer 24 makes it feasible to make a conductive, wide area contact with regions 14 and 16. Conductive layer 24 completely surrounds regions 14 and 16 except at the upper surface thereof, thus substantially bypassing the resistances of these regions. Conductive layer 24 is easily contactable at the surface of the wafer by means of collector contact 26 and low resistivity N+ diffused region 28 which is contiguous layer 24. It will be apparent that the transistor formed in region 12 will have a far lower parasitic collector resistance and consequently better noise immunity and current carrying capacity in digital circuits and lower power operation with improved linearity in R.F. circuits than prior art transistors in which a conductive layer such as 24 was not incorporated. Other advantages will also be apparent to the circuit designer.

The structure of FIG. 1(*c*) can be produced utilizing either one of two distinct techniques. The first, which will be referred to hereinafter as the Schnable oxide isolation process, is described in the copending application of George L. Schnable, entitled "Process," filed of even date herewith, Ser. No. 404,804. The second, which will be referred to as the "lapped-wafer oxide isolation process," is described, for example, at pp. 65–6 of Electronics Products for August 1964.

FIGS. 1(*a*), 1(*b*), and 1(*c*) show the fabrication of the circuit of FIG. 1(*c*) according to the Schnable oxide isolation process. Referring first to FIG. 1(*a*), a starting wafer 30 of N+ type (low resistivity) silicon having a thickness great enough to prevent fracture due to handling is placed in an epitaxial growth furnace. A layer of N-type silicon 32 is epitaxially grown on water 30. Thereafter the surface of layer 32 is thermally oxidized to form thereover a layer 34 of silicon dioxide ($SiO_2$). Next, a layer 36 of polycrystalline silicon, which will provide physical support for the underlying structure, is vapor deposited on layer 34. Since layer 36 now provides physical support for the wafer, the thickness of low resistivity layer 30 may be reduced to any desired dimension by etching or a combination of lapping and etching.

Next, referring to FIG. 1(*b*), electrically isolated regions are formed from layers 30 and 32 as follows. A surface oxide (not shown) is grown on the exposed face of layer 30. Then this surface oxide is selectively etched away in order to form a plurality of oxide islands, each masking a region of layers 30 and 32 which is to be a circuit component containing region. Thereafter an etchant which will attack silicon but not its oxide is applied to this oxide layer and the exposed surface of layer 30 in order to etch material from the layers 30 and 32, thereby to form separate individual isolated regions such as 12 in which circuit components later are to be formed. The etchant etches troughs such as 38 around each isolated region such as 12. These troughs may be narrow as shown or may be substantially wider than as shown, according to the particular circuit configuration to be formed in the microcircuit monolith. Next, according to the present invention, the oxide remaining on the bottom of layer 30 is etched away, and conductive layer 24 is deposited over the now exposed surfaces of layers 30, 32 and 34. Conductive layer 24 may be deposited selectively over the face of only certain component-containing regions of the wafer, such as region 12 only, if desired, by suitably masking those regions upon which no conductive layer is to be formed.

In the presently preferred embodiment of the invention, conductive layer 24 should be formed of molybdenum disilicide. Molybdenum disilicide is a much better conductor than an N+ silicon layer, for example; its resistivity (21.5 micro-ohm-cm.) approximates that of iron (10 micro-ohm-cm.). The resistivity of a heavily-doped (N++ or P++) semiconductor, on the other hand, is about 1,000 micro-ohm-cm., or over an order of magnitude greater than $MoSi_2$. One preferred way of forming a layer 24 of molybdenum disilicide is by vapor plating a layer of molybdenum metal by the hydrogen reduction of molybdenum pentachloride at about 800° C., and then heating the substrate to about 1100–1200° C. so that the deposited layer of metallic molybdenum will combine with the silicon of regions 12 and 14 to produce the layer 24 of $MoSi_2$. Alternatively, the $MoCl_5$ can be reduced with hydrogen at about 1100–1200° C. so that the *a* layer 24 of $MoSi_2$ will be formed as the molybdenum metal is vapor deposited. At the bottom of troughs 38, where no silicon substrate is present but rather only the exposed part of silicon dioxide layer 34, the deposited molybdenum will be unable to combine with any silicon and will be deposited as metallic molybdenum portions 40.

Although molybdenum disilicide is preferred for layer 24, many other materials may be used in lieu thereof. For instance, a layer of metallic molybdenum may be deposited in lieu of the silicide. Since the following metals are sufficiently refractory to withstand semiconductor processing temperatures, and since their silicides are conductive, they also may be used for layer 24, either in their metallic state or as a silicide: titanium, zirconium, vanadium, niobium, tantalum, chromium, tungsten, thorium, and hafnium. If any of the foregoing metals is deposited in its metallic state, it will of course later react with the adjacent silicon during the usual high-temperature semiconductor processing operations to form a corresponding silicide unless the metal is isolated from silicon, as is layer 48 in the embodiment of FIG. 5. The resistivities of the corresponding metallic silicides are generally less than 50 micro-ohm-cm., e.g., vanadium silicide ($ViSi_2$) has a resistivity of 9.5 micro-ohm-cm.; niobium silicide ($NbSi_2$) has a resistivity of 6.3 micro-ohm-cm.; tantalum silicide ($TaSi_2$) has a resistivity of 8.5 micro-ohm-cm.; chromium silicide ($CrSi_2$) has a resistivity of 7.0 micro-ohm-cm.; and tungsten silicide ($WSi_2$) has a resistivity of 33.4 micro-ohm-cm. Titanium silicide ($TiSi_2$) has a resistivity of 123.6 micro-ohm-cm. and zirconium silicide ($ZrSi_2$) has a resistivity of 161.0 micro-ohm-cm., but these silicides are not presently preferred for use in the invention. If zirconium or titanium is used, it is advisable to deposit these metals under reduced temperature conditions to avoid any detrimental reaction between the metal and the silicon dioxide of layer 34 or the silicon dioxide layer 22 which will later be formed over conductive layer 24. Thorium is a radioactive metal and accordingly its use may be restricted to certain specialized applications. All of the above metals except thorium and titanium may be deposited from the chloride, the latter two being depositable from the iodide only.

The metallic portions 40, which would interconnect adjacent circuit component regions if not removed, can be removed by using a suitable etchant such as nitric acid which will attack molybdenum metal but not its silicide. If a metallic layer 24 is deposited, portions 40 may be removed using photolithographic selective etching techniques.

Next, referring to FIG. 1(*c*), the electrically insulating oxide layer 22 is grown over the bottom of the wafer. Layer 22 may be grown by thermal oxidation, in which case part of the molybdenum silicide layer 24 will be converted to quartz. Alternatively, the oxide film may be grown by first depositing a polycrystalline layer of silicon about 1 micron thick by conventional means (e.g., the hydrolysis of silicon tetrachloride or by decomposing an organic silane) and then thermally oxidizing the silicon to produce the required oxide film. The oxide thickness will be about twice the silicon thickness when the silicon is completely oxidized. If the silicon film is incompletely oxidized, the underlying silicon layer will have no deleterious effects. The use of this alternative method will be required if a metallic molybdenum layer 24 is used.

After oxide layer 22 has been formed, a layer of polycrystalline silicon 42 is grown over the region 12 and the other component-containing regions. Layer 42 provides physical support for these regions and constitutes the body of the semiconductive monolith. After layer 42 is grown, supporting layer 36 of FIGS. 1(*a*) and 1(*b*) may be removed with an etchant which will attack silicon but not its oxide. Next the resulting transistor structure shown may be formed according to conventional diffusion techniques such as those described in U.S. Patent 3,025,589 to Hoerni. Concommitant with the diffusion of emitter region 20, a high concentration N-type region 28 may be diffused adajacent the edge of the component containing region 12 to contact conductive layer 24. A conventional collector contact 26 then may be applied to region 28.

Further details concerning the dimensions, particular materials, etchants, etc., used in the above fabrication procedure may be obtained by reference to the copending application of G. L. Schnable, referred to supra.

Alternatively, the structure of FIG. 1(*c*) may be produced according to the lapped-wafer oxide isolation process. According to this process an N+ type layer is diffused into a relatively thick N-type silicon wafer. Thereafter the circuit component regions such as 12 are formed by etching troughs in the wafer such as 38 from the diffused side thereof. These regions are next covered with the conductive layer of the invention such as 24, and then by an insulating oxide layer such as 22. Next a relatively thick polycrystalline layer of silicon such as 42 is grown over the oxide layer 22. Thereafter the wafer is turned over and lapped down through the bottoms of the troughs. The resulting surface is etched to remove surface imperfections, oxidized, and transistors and other elements are diffused into the respective regions in a conventional manner. The conductive coating 24 will be separated into individual discontinuous coatings around the respective regions since the aforedescribed lapping step will remove the portions of layer 24 deposited on the bottoms of the troughs.

The Schnable oxide isolation process is preferred over the lapped-wafer oxide isolation process, principally because no critical lapping step is required in the Schnable process, and for other reasons described in the Schnable application referred to supra.

FIG. 2

FIG. 2 shows a microcircuit monolith including a ground plane according to the invention. Wafer 10 of FIG. 2 represents a typical microcircuit monolith in which various circuit components are formed in electrically isolated component-containing regions such as 12. A transistor is shown formed in region 12 for exemplary purposes. Region 12 is isolated from the body of the wafer 42 by an insulating oxide film 22 similar to film 22 of FIG. 1. Between film 22 and the body of the wafer 42 is a conductive layer 44 according to the present invention which acts as a ground plane against which the circuit components formed in regions such as 12 may operate electrically. A contact is made to region 44 at 46 on the surface of the wafer.

The structure of FIG. 2 of the drawing may be produced by the Schnable oxide isolation process in the following manner. The structure of FIG. 1(*b*) without conductive film 24 is fabricated in the manner described above. Then an oxide film 22 about 1.5 microns thick is thermally grown over the surface of region 12. Next a conductive coating 44 is applied over this oxide film using the same steps that were used to apply conductive coating 24 in FIG. 1(*b*).

Layer 44 may be a metallic layer or a metallic silicide. If a metallic layer is employed, it may be vapor deposited according to conventional techniques. However it is preferred that a metallic silicide be employed instead of a plain metallic layer. A metallic silicide is more stable than a plain metal and consequently will not attack oxide layer 22. A metallic silicide may be formed by codepositing metal and silicon through hydrogen reduction of their chlorides in the same deposition apparatus. The deposition apparatus should be operated at a temperature well above the higher deposition threshold temperature of the two metals being deposited. The composition of layer 44 can be controlled precisely by controlling the relative partial pressures of the two chlorides employed. For example, molybdenum pentachloride and silicon tetrachloride and hydrogen can be introduced at suitable pressures into the deposition apparatus and layer 34 will be deposited as molybdenum silicide.

If the microcircuit monolith is operated so that wafer 42 is at the same potential as ground plane 44, the structure of FIG. 2 may be employed directly. However, if it is desired that layer 44 be isolated from wafer 42, then another insulating oxide layer (not shown) may be grown on top of layer 44 in the same manner that oxide layer 22 of FIG. 1 was grown. Thereafter polycrystalline layer 42 is grown on layer 44 or any oxide layer which may be deposited on layer 44. Next the supporting layer similar to layer 36 of FIGS. 1(*a*) and 1(*b*) is removed and the desired devices are formed in the component-containing regions according to conventional techniques. A suitable hole should be etched in surface oxide layer 34 so that a ground plane contact 46 may be connected electrically to layer 44.

FIG. 3

The structure of FIG. 3 is similar to that of FIG. 2 in that a microcircuit with a ground plane is shown. However the structure of FIG. 3 is produced by the lapped-wafer oxide isolation process, requiring slightly different techniques.

It will be recalled that in the lapped-wafer oxide isolation process the portion of layer 24 at the bottom of the trough 38 were sliced off in the lapping step. Accordingly, in a microcircuit with a ground plane produced according to the lapping isolation process, the ground plane will not be physically or electrically continuous.

This is illustrated in FIG. 3, wherein ground plane layer 44' is interrupted at the edge of each component-containing region. The separate segments of ground plane layer 44' are interconnected electrically by diffusing a low resistivity P-type zone 47 between adjacent circuit component-containing regions. Zone 47 interconnects the separate portions of ground plane 44' and effectively renders the ground plane electrically continuous.

The separate segments of ground plane 44' may be interconnected in an alternative manner (not shown) by etching cuts through oxide layer 34 to meet separate segments of ground plane 44' and thereafter evaporating appropriate conductive surface contacts to bridge the separate segments of the ground plane.

FIG. 4

If the conductive coating around the individual component-containing regions (such as shown in FIG. 1(c)) is incorporated in the structure of FIG. 2, the structure shown in FIG. 4 will be produced. In FIG. 4 the component-containing region 12 is surrounded by a conductive coating 24 which in turn is surrounded by the insulating oxide layer 22 similar to that shown in FIG. 1(c). A ground plane 44' is deposited on top of oxide layer 22 after which supporting layer 42 is added. Alternatively a second oxide layer (not shown) may be deposited over ground plane layer 44' before supporting layer 42 is added if it is desired to operate ground plane layer 44' at a different potential from that of body 42 of wafer 10.

The structure of FIG. 4 may be produced by the same technique as the structure of FIG. 1(c) except that layer 44' is formed after the formation of layer 22. Layer 44' may be formed in the same manner as layer 44 of FIG. 2 was formed.

It will be noted that the structure of FIG. 4 provides a microcircuit having the combined advantages of a conductive coating around the individual component-containing regions plus a ground plane.

FIG. 5

FIG. 5 shows a microcircuit incorporating a conductive coating around the component-containing regions and an underlying circuit interconnection layer which may be used to provide suitable interconnections between circuit components in the same monolith. For examplary purposes the structure of FIG. 5 will be discussed with respect to the interconnection of the collector of a transistor formed in the region 12 with the base of a second transistor formed in a separate component-containing region 52. It will be appreciated, however, that according to the present invention many other types of circuit components may be formed in the respective regions and various other types of interconnections may be provided.

It will be noted that region 12 is surrounded by a conductive coating 24 corresponding to the conductive coating 24 of FIG. 1(c). An oxide coating 22 surrounds layer 24. A second conductive layer 48 is deposited over oxide coating 22. Layer 48 forms the circuit interconnection layer of the present invention. A second oxide film 50 is formed over layer 48 to insulate layer 48 from body 42 of wafer 10. The transistors formed in regions 12 and 52 have emitter, base, and collector regions. The collector of the transistor formed in region 12 is interconnected with layer 48 at 54, where oxide film 22 has been interrupted. Layer 48 is connected to the base contact 56 of the transistor formed in region 52 by a surface contact 56 which makes contact with layer 48 through a hole in surface oxide layer 34 and underlying oxide layer 22. Alternatively, the collector of the transistor of region 12 may be connected to the emitter contact 60 of the transistor of region 52 by forming a different surface contact bridge similar to bridge 58 but perpendicular to the plane of the drawing so as not to interfere with base contact 56.

It will be appreciated that the present process can be extended to the connection of as many elements of as many components as desired using a combination of surface interconnecting films 58 and underlying interconnection layers such as 48. For this purpose films 48 and 58 may be deposited in suitable patterns through appropriate masks.

The structure of FIG. 5 may be produced in the following manner. A structure similar to that of FIG. 1(b) is produced with separated component-containing regions similar to 12 and 52. Thereafter the conductive coating 24 is formed in manner previously described. Next the insulating oxide layer 22 is formed. Thereafter, using photolithographic techniques such as described in the previously mentioned Hoerni patent, a hole is etched through layer 22 at 54. Next layer 48 is evaporated over layer 22. Layer 48 will thus contact layer 24 at point 54 where the hole was previously cut in oxide layer 22. Thereafter a second oxide layer 50 is formed and body 42 of the wafer 10 is deposited according to techniques previously discussed. Thereafter the supporting layer similar to 36 of FIG. 1(b) is removed, and suitable holes are etched through oxide coating 34 in order to diffuse the respective zones of the different component-containing regions. Also a hole is etched through oxide layer 34 at 60 so that the evaporated metal contact 58 can reach the underlying interconnection layer 48.

It will be apparent that the structure of FIG. 5 can be built without any conductive layer 24 surrounding region 52. Also no conductive layer 24 need be formed around component-containing region 12, in which case a very large hole should be etched through oxide layer 22 at 54 in order to form a broad or wide area contact with the low resistivity zone 14 of the transistor of region 12.

Although what has been described are at present considered to be the preferred embodiments of the invention, it will be apparent that various modifications and other embodiments thereof will occur to those skilled in the art within the scope of the invention. Accordingly, it is desired that the scope of the invention be limited by the appended claims only.

I claim:

1. In combination:

(a) a body of semiconductive material having a first surface, (b) a region of monocrystalline semiconductive material within said body, said region having a first surface coplanar with and forming part of said first surface of said body, and (c) at least three layers, including insulating and conductive layers, separating said monocrystalline region from the rest of said body, one of said layers being a conductive layer having a resistivity of less than 50 micro-ohm-centimeters, at least a part of said layers separating the surface of said monocrystalline region opposite said first surface thereof from said rest of body, said insulating and conductive layers alternating between said rest of said body and said region.

2. A semiconductive device, comprising in combination:

(a) a body of semiconductive material having at least one substantially flat surface, (b) a region of monocrystalline semiconductive material within said body, said region having at least one substantially flat surface which forms a part of and is coplanar with said surface of said body, (c) a conductive layer comprising $MoSi_2$ between said region and the rest of said body, said layer having a resistivity of less than 50 micro-ohm-cm., at least a part of said layer separating the surface of said region opposite said flat surface thereof from said body, (d) an insulating layer comprising $SiO_2$ between said conductive layer and said rest of said body, and (e) means for contacting said conductive layer from said surface.

3. A semiconductive monolith, comprising, in combination:

(a) a body of polycrystalline semiconductive material having at least one substantially flat surface, (b) a region of microcrystalline semiconductive material within said body, said region having at least one substantially flat surface which forms part of and is coplanar with said one surface of said body, (c) three successive layers between said region and the rest of said body, the innermost and outermost being conductive, the center being insulating, and (d) means for contacting said innermost layer from said surface.

4. The combination of claim 3 wherein said semiconductive materials are silicon, said insulating layer is silicon dioxide, and said conductive layers are silicides of substances selected from the group consisting of molybdenum, titanium, zirconium, vanadium, niobium, tantalum, chromium, tungsten, hafnium, and thorium.

5. A monolithic microcircuit having an internal component interconnection layer comprising, in combination:

(a) a wafer of semiconductive material having at least one substantially flat surface, (b) at least two regions of semiconductive material within said wafer, each of said regions having at least one substantially flat surface which forms part of and is coplanar with said flat surface of said wafer, (c) a continuous conductive layer between each of said regions and the rest of said wafer of semiconductive material, (d) means insulating said conductive layer from said regions and the rest of said wafer, (e) means connecting said conductive layer to a given part of one of said regions, and (f) means connecting said conductive layer to a given part of the other of said regions.

6. The microcircuit of claim 5 further including respective separate conductive coatings between each of said regions and said body, each of said coatings being continuous about a respective region.

7. The microcircuit of claim 5 wherein said body and said regions are silicon and said means of clause (d) comprises two layers of silicon dioxide, said silicon dioxide layers being disposed on opposite sides, respectively, of said conductive layers.

8. A monolithic microcircuit comprising, in combination:

(a) a monolith of semiconductive material having at least one substantially flat surface, (b) a plurality of separate regions in said monolith, each having at least one substantially flat surface forming part of and coplanar with said flat surface of said monolith, (c) a continuous connecting layer between said regions and the rest of said monolith, (d) two electrically insulating layers on either side of said connecting layer for insulating said layer from said regions and the rest of said monolith, and (e) means connecting said connecting layer to a given part of each of said regions.

9. The microcircuit of claim 8 wherein one of said regions includes a transistor having base, emitter, and collector zones, said connecting layer being connected to one of said zones.

10. The microcircuit of claim 9 wherein said monolith and said regions are silicon, said insulating layers are silicon dioxide, and said connecting layer is molybdenum disilicide.

11. A semiconductive device, comprising in combination:

(a) a body of silicon having at least one substantially flat surface, (b) a region of monocrystalline silicon within said body, said region having at least one substantially flat surface which forms a part of and is coplanar with said surface of said body, (c) a conductive layer between said region and the rest of said body, said layer comprising a disilicide of a substance elected from the group consisting of molybdenum, titanium, zirconium, vanadium, niobium, tantalum, chromium, tungsten, hafnium, and thorium, said layer having a resistivity of less than 50 micro-ohm-centimeters, at least a part of said layer separating the surface of said monocrystalline region opposite said flat surface thereof from said rest of body, (d) an insulating layer between said conductive layer and said rest of said body, and (e) means for contacting said conductive layer from said surface.

References Cited

UNITED STATES PATENTS

| | | | |
|---|---|---|---|
| 3,114,865 | 12/1963 | Thomas | 317—234 |
| 3,210,620 | 10/1965 | Lin | 317—235 |
| 3,236,701 | 2/1966 | Lin | 317—235 |
| 3,254,277 | 5/1966 | Aarons | 317—235 |
| 3,260,902 | 7/1966 | Porter | 317—235 |
| 3,290,753 | 12/1966 | Chang | 317—235 |
| 3,312,879 | 4/1967 | Godejahn | 317—235 |
| 3,312,882 | 4/1967 | Pollock | 317—235 |
| 3,320,485 | 5/1967 | Buie | 317—235 |

JOHN W. HUCKERT, *Primary Examiner.*

JAMES D. KALLAM, *Examiner.*

R. F. POLISSACK, *Assistant Examiner.*